United States Patent [19]

Hause et al.

[11] Patent Number: 5,904,539
[45] Date of Patent: May 18, 1999

[54] SEMICONDUCTOR TRENCH ISOLATION PROCESS RESULTING IN A SILICON MESA HAVING ENHANCED MECHANICAL AND ELECTRICAL PROPERTIES

[75] Inventors: Fred N. Hause, Austin; Robert Dawson; Charles E. May, both of Austin; Mark I. Gardner, Cedar Creek, all of Tex.; Kuang-Yeh Chang, Los Gatos, Calif.

[73] Assignee: Advanced Micro Devices, Inc.

[21] Appl. No.: 08/619,004

[22] Filed: Mar. 21, 1996

[51] Int. Cl.$^6$ .................................................. H01L 21/76
[52] U.S. Cl. ........................ 438/427; 438/435; 438/437; 148/DIG. 50
[58] Field of Search .................................. 438/424, 427, 438/428, 435, 437; 148/DIG. 50

[56] References Cited

U.S. PATENT DOCUMENTS

| | | |
|---|---|---|
| 4,211,582 | 7/1980 | Horng et al. . |
| 4,274,909 | 6/1981 | Venkataraman et al. . |
| 4,385,975 | 5/1983 | Chu et al. . |
| 4,390,393 | 6/1983 | Ghezzo et al. . |
| 4,445,967 | 5/1984 | Kameyama . |
| 4,532,701 | 8/1985 | Kameyama et al. . |
| 4,671,970 | 6/1987 | Keiser et al. . |
| 4,868,136 | 9/1989 | Ravaglia . |
| 4,871,685 | 10/1989 | Taka et al. . |
| 4,873,203 | 10/1989 | Kaga et al. . |
| 4,906,585 | 3/1990 | Neppl et al. . |

(List continued on next page.)

FOREIGN PATENT DOCUMENTS

| | | |
|---|---|---|
| 0300569 | 1/1989 | European Pat. Off. . |
| 0461498 | 12/1991 | European Pat. Off. . |
| 56-140641 | 11/1981 | Japan . |
| 57-91535 | 6/1982 | Japan . |
| 58-42251 | 3/1983 | Japan . |
| 58-220444 | 12/1983 | Japan . |
| 59-87831 | 5/1984 | Japan . |
| 0186342 | 10/1984 | Japan . |
| 0015944 | 1/1985 | Japan . |
| 60-38831 | 2/1985 | Japan . |
| 61-85838 | 5/1986 | Japan . |
| 61-166042 | 7/1986 | Japan . |
| 2-140951 | 5/1990 | Japan . |
| 0272745 | 11/1990 | Japan . |
| 0062946 | 3/1991 | Japan . |
| 3-96249 | 4/1991 | Japan . |
| 0190663 | 7/1993 | Japan . |

OTHER PUBLICATIONS

Wolf, "Silicon Processing For the VLSI Era, vol. 1, Process Technology", Lattice Press, 1986, pp. 407–458.

IBM Technical Disclosure Bulletin, "Forming Wide Trench Dielectric Isolation", Apr. 1983, 2 pages.

*Primary Examiner*—Trung Dang
*Attorney, Agent, or Firm*—Kevin L. Daffer; Robert C. Kowert; Conley, Rose & Tayon

[57] ABSTRACT

An isolation technique is provided for improving the overall planarity of filled isolation regions relative to adjacent silicon mesas. The isolation process results in a silicon mesa having enhanced mechanical and electrical properties. Planarity is performed by repeating the steps of filling isolation trenches, patterning large area isolation trenches, and refilling isolation trenches to present an upper surface having indents which can be readily removed by a chemical-mechanical polish. The silicon mesa upper surface is enhanced by utilizing a unique set of layers stacked upon the silicon substrate, and thereafter patterning the substrate to form raised silicon surfaces, or mesas, having the stacked layers thereon. The patterned, stacked layers include a unique combination of dissimilar compositions which, when removed, leave a silicon mesa upper surface which is recessed below the adjacent, filled trenches. The patterned stacked layers incorporate a polysilicon and/or oxide buffer which prevents deleterious migration of nitrogen from the overlying nitride layer to the underlying silicon mesa upper surface.

15 Claims, 4 Drawing Sheets

U.S. PATENT DOCUMENTS

| | | |
|---|---|---|
| 4,952,524 | 8/1990 | Lee et al. . |
| 4,980,311 | 12/1990 | Namose . |
| 4,994,406 | 2/1991 | Vasquez et al. . |
| 5,004,703 | 4/1991 | Zdebel et al. . |
| 5,011,788 | 4/1991 | Kawaji et al. . |
| 5,096,848 | 3/1992 | Kawamura . |
| 5,175,122 | 12/1992 | Wang et al. . |
| 5,225,358 | 7/1993 | Pasch . |
| 5,229,315 | 7/1993 | Jun et al. . |
| 5,229,316 | 7/1993 | Lee . |
| 5,231,046 | 7/1993 | Tasaka ................................. 438/437 |
| 5,292,689 | 3/1994 | Cronin . |
| 5,294,562 | 3/1994 | Lur et al. . |
| 5,308,784 | 5/1994 | Kim et al. . |
| 5,308,786 | 5/1994 | Lur . |
| 5,371,036 | 12/1994 | Lur et al. . |
| 5,372,968 | 12/1994 | Lur et al. . |
| 5,691,252 | 11/1997 | Pan . |
| 5,696,020 | 12/1997 | Ryum . |

SEMICONDUCTOR TRENCH ISOLATION PROCESS RESULTING IN A SILICON MESA HAVING ENHANCED MECHANICAL AND ELECTRICAL PROPERTIES

BACKGROUND OF THE INVENTION

1. Field of the Invention

This invention relates to semiconductor fabrication and more particularly to an improved process of forming a silicon mesa between trench isolation regions, the silicon mesa having enhanced mechanical and electrical properties.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS process involves oxidizing field regions between devices. The oxide grown in field regions are termed field oxide, wherein field oxide is grown during the initial stages of integrated circuit fabrication, before source and drain implants are placed in device areas or active areas. By growing a thick field oxide in field regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends laterally as a bird's-beak structure. In many instances, the bird's-beak structure can unacceptably encroach into the device active area. Second, the pre-implanted channel-stop dopant oftentimes redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". Despite advances made to decrease bird's-beak, channel-stop encroachment and non-planarity, it appears that LOCOS technology is still inadequate for deep submicron MOS technologies. The shallow trench process is better suited for isolating densely spaced active devices having field regions less than one micron in lateral dimension.

The trench process involves the steps of etching a silicon substrate surface to a relatively shallow depth, e.g., between 0.3 to 0.5 microns, and then refilling the shallow trench with a deposited dielectric. Some trench processes include an interim step of growing oxide on trench walls prior to the trench being filled with a deposited dielectric. After the trench is filled, it is then planarized to complete the isolation structure.

The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

While the trench isolation process has many advantages over LOCOS, it cannot in all instances achieve complete global planarization across the entire semiconductor topography. The upper surface of fill dielectric in large isolation areas are at lower elevation levels than the upper surface fill dielectric in small isolation areas. Further manipulation of the fill dielectric surface is needed to provide an elevationally uniform fill dielectric surface across both large isolation areas (e.g., greater than 2.0 microns per side) and small isolation areas (e.g., less than 1.0 micron per side). The trench process presents many additional problems besides that of local planarization. First, conventional chemical vapor deposition (CVD) processes exhibit a tendency to form cusps and/or voids at the midline between closely spaced active areas, hereinafter termed "silicon mesas". Those voids can lead to reliability problems and inadequate isolation performance. Second, conventional planarization techniques used to remove the fill dielectric from the upper surface of silicon mesas may over etch the fill dielectric in the isolation areas relative to the silicon mesas. An over etched fill surface which is elevationally lower than an adjacent active area silicon mesa causes the mesa sidewall and corner to be partially exposed. Any exposure at the silicon mesa corner or sidewall causes inappropriate fringing field effects and/or parasitic sidewall conduction. It is therefore important when choosing a planarization method, that the method not expose the silicon mesa corner or sidewall. Lastly, it is important to protect the silicon mesa upper surface during the fill procedure and subsequently during planarization. The silicon mesa surface must be left in pristine condition so as to allow formation of a high quality gate or tunnel oxide thereon. Local thinning of the resulting gate and/or tunnel oxide cannot be tolerated in high density integrated circuits employing short channels.

SUMMARY OF THE INVENTION

The problems outlined above are in large part solved by an improved shallow trench process of the present invention. The shallow trench process hereof demonstrates substantially global planarization of both large and small trench isolation regions relative to silicon mesas. Moreover, the trench process protects the silicon mesa upper surface during the dielectric fill procedure and subsequent planarization procedure by configuring the silicon mesa upper surface with a unique combination of stacked layers. Preferably, the stacked layers are placed on the silicon substrate prior to trench formation. After the trench is formed, a fill dielectric (i.e., oxide) is deposited across the trench and stacked layers. The fill dielectric is preferably deposited from within a low pressure chemical vapor deposition (LPCVD) chamber. The oxide source material is suitably derived from a tetraethoxysilane source, generally referred to in the industry as "TEOS". Alternatively, the fill dielectric can be obtained from an atmospheric-pressure, ozone-TEOS source. In either instance, the TEOS source and LPCVD or atmospheric-pressure, ozone-enhanced TEOS produces a fill dielectric with minimal voids in small trench isolation regions.

The fill dielectric covering the trench isolation and silicon mesa regions is planarized by applying a chemical-mechanical polish step after small trench isolation regions are filled. One or more additional fill procedures may be necessary to fill any remaining, larger trenches which were not filled by the first fill procedure. Chemical-mechanical polish is reapplied to the second fill dielectric upper surface, and determination is then made as to whether global planarization has been achieved. If global planarization does not occur after the second fill and second chemical-mechanical polish, then the fill and polish steps are again repeated for as many times as necessary to fill continuously larger isolation trenches. Between each fill and polish step, a masking step is used to selectively mask (or protect) fill dielectric in large isolation regions. The masking step prevents fill dielectric at the base of large isolation regions from being removed by an etch step. By masking the large isolation regions, small indentations are produced in the fill dielectric upper surface near the periphery of large isolation regions. Depending upon the size of the trench isolation region, the small indentations can be removed during the subsequent chemical-mechanical polish step. If the indentations are not removed, then the dielectric fill/mask/polish step is repeated as described above.

To ensure the corners and sidewalls of silicon mesa upper surfaces are not exposed, a carefully selected combination of layers are stacked across the silicon mesa upper surface. The stacked layers are selectively removed with careful control and attention paid to the rate at which fill dielectric in adjoining isolation trenches is removed. The patterned layers are chosen such that after their removal, the exposed silicon mesa upper surface is elevationally below the fill dielectric upper surface within isolation trenches. Furthers the stacked layers are chosen to prevent damage to the underlying silicon mesa upper surface during the etch and/or chemical-mechanical polish processes. The gate and/or tunnel oxide subsequently formed on the exposed silicon mesa upper surface demonstrates improved quality in the form of, e.g., higher charge breakdown voltage ($Q_{BD}$).

Broadly speaking, the present invention contemplates a method for forming a silicon mesa between a pair of trench isolation regions. The method comprises the steps of providing a silicon substrate of substantially uniform substrate thickness. A first oxide is then formed upon the silicon substrate. Thereafter, polysilicon is deposited upon the first oxide, followed by second oxide deposited upon the polysilicon. Finally, silicon nitride is deposited upon the second oxide. The resulting stack of silicon nitride, second oxide, polysilicon, first oxide, and a portion of the substrate thickness is removed to form a trench isolation region.

The present invention further contemplates a method for forming a planarized integrated circuit topography. The method includes the steps of removing layers of silicon nitride, oxide and polysilicon as well as a partial thickness of silicon substrate underlying the silicon nitride, oxide and polysilicon to form a spaced pair of isolation trenches within the semiconductor substrate. Thereafter, a first fill oxide is deposited within the pair of isolation trenches. A portion of the first fill oxide is removed except for that which has been selectively masked by photoresist. Thereafter, a second fill oxide is deposited to form indents within an upper surface of the second fill oxide in registry above the periphery of the region being masked. A chemical-mechanical polishing step is used to remove the indents and all fill oxide (first and second fill oxide) to an elevational level approximately equal to the median thickness of the silicon nitride layer. The remaining layers of silicon nitride, oxide and polysilicon are then removed from the silicon mesa surfaces in regions between respective pairs of isolation trenches.

The present invention still further contemplates a method for forming a planarized topography of dielectric material, wherein an integrated circuit topography comprises at least three silicon surfaces, or silicon mesas, extending from a silicon substrate. Two of the three silicon surfaces are spaced from each other a short distance, and two of the three silicon surfaces dissimilar from one of the first two silicon surfaces, are spaced from each other a long distance greater than the short distance. A first oxide fill layer is deposited upon the silicon surfaces and the silicon substrate, followed by a masking layer applied over the first oxide fill layer and across a portion of the long distance. The first oxide fill layer, except for the first oxide fill layer underlying the masking layer, is removed. A second oxide fill layer is deposited upon what remains of the first oxide fill layer to form indents within the upper surface of the second oxide layer underlying a periphery of the masking layer.

The present invention yet further contemplates a silicon mesa comprising a stack of first oxide, polysilicon, second oxide and silicon nitride layers placed over an elevationally raised silicon surface. The silicon mesa further comprises a laterally adjoining isolation trench filled with LPCVD oxide. The LPCVD oxide comprises an upper oxide surface of higher elevation than the elevationally raised silicon surface.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
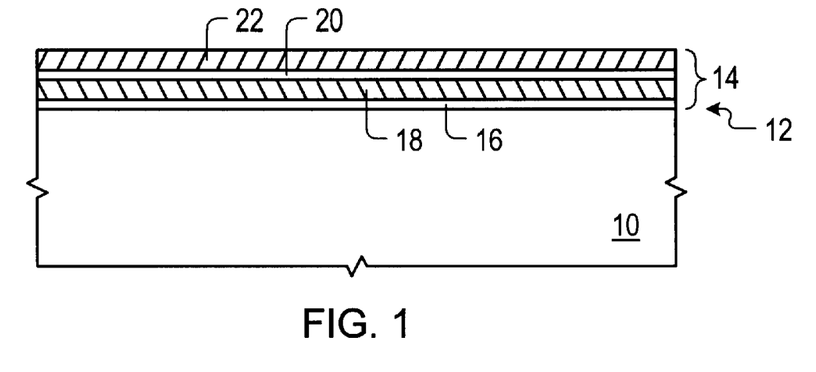
FIG. 1 is a partial cross-section of a semiconductor substrate having a stacked set of layers formed thereon.

Turning now to drawings, FIG. 1 illustrates a partial cross-sectional view of a semiconductor substrate 10. Substrate 10, preferably made from a single crystal silicon source, includes an upper surface 12 upon which a plurality of stacked layers 14 are deposited. According to one embodiment, stacked layers 14 comprise a first oxide 16, polysilicon 18, second oxide 20 and nitride 22. First oxide 16 can be either deposited from a chemical vapor deposition (CVD) source or thermally grown to a thickness between, e.g., 100 to 300 angstroms. Polysilicon 18 is deposited either from an atmospheric pressure CVD (APCVD) or a low pressure CVD (LPCVD) system to a thickness between, e.g., 400 to 2000 angstroms. Second oxide 20 is deposited from a CVD chamber or grown from a thermal source to a thickness suitably similar to first oxide 16. Nitride 22 is deposited from a CVD chamber or a plasma source to a thickness between, e.g., 400 to 2000 angstroms. CVD techniques and the various feed gas compositions necessary to form layers 16 through 22 are generally known in the art. It is the particular combination of nitride 22 over second oxide 20, and second oxide 20 over polysilicon 18, and polysilicon 18 over first oxide 16 which imparts a benefit set forth hereinbelow. According to an alternative embodiment, second oxide 20 can be eliminated leaving nitride 22 deposited directly upon polysilicon 18. It is preferred, however, that the first embodiment be used to minimize stress at the nitride-polysilicon boundary, and to allow process control in the selective patterning and removal of layers.

Figure 2:
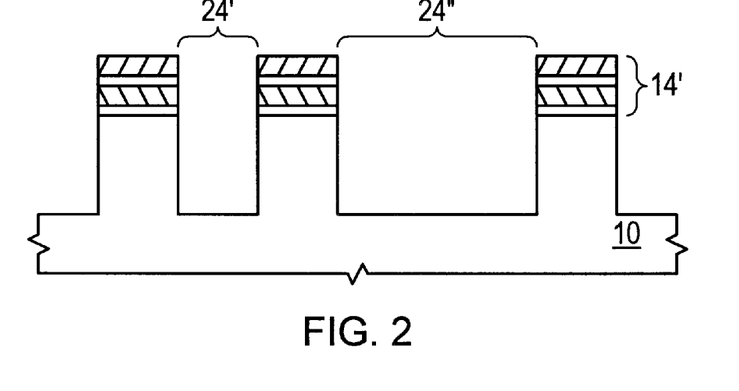
FIG. 2 illustrates the semiconductor substrate stacked layers of FIG. 1 patterned to form large and small trench isolation regions interspersed between silicon mesas.

FIG. 2 indicates a subsequent processing step to that shown in FIG. 1. Specifically, FIG. 2 illustrates selective patterning of stacked layers 14 and surface 12. Stacked layers 14 and substrate 10 are selectively removed through a series of etch steps beginning by selectively removing nitride 22. Nitride 22 is preferably dry etched using a chlorine species within the plasma. Combined with the chlorine species is typically a polymer-forming species such as carbon which helps passivate the remaining nitride sidewall. The dry etch process is fairly selective to the underlying oxide, i.e., second oxide 20.

Once nitride 22 is selectively removed, underlying oxide 20 is removed using, e.g., a HF and $H_2O$ wet etch solution. Alternatively, a plasma etch using, for example, $CHF_3$ etchant can be used. In either instance, the etch material chosen demonstrates high selectivity to underlying polysilicon 18. Accordingly, the etch material assures, like nitride 22, that exposed second oxide 20 is fully removed. Polysilicon 18, exposed as a result of second oxide 20 selective removal, is then removed using a plasma etching scheme to achieve high selectivity to underlying first oxide 16. Poly 18 plasma etch material includes any halogen component such as fluorine or chlorine (i.e., $BCl_3$, $Cl_2$) and may also include an $SF_6$ component. The plasma removes exposed poly 18 in lieu of underlying first oxide 16. The resulting exposed first oxide 16 is removed using HF wet etch solution or dry etch separately or in combination with the nitride etch.

Whenever wet etching is called for, the wet etching process involves immersing the exposed (non-masked) surfaces in an etchant solution followed by, for example, a cleaning step involving deionized water. Plasma etching can be carried out using a parallel plate reactor configured in the plasma etch mode or reactive ion etch (RIE) mode. In either instance, wet etch or plasma etch conditions are chosen to carefully and controllably remove layer-by-layer select regions of stacked layers 14. The unique configuration of layers, and the method in which they are removed, ensures high selectivity to the underlying base material. Removal of the upper surface 12 is continued to a depth within substrate 10 but prior to removal of more than, for example, 0.3 to 0.5 microns as measured from upper surface 12. Thus, FIG. 2 illustrates the formation of isolation trenches 24 etched within substrate 10 to a depth of 0.3 to 0.5 microns. Isolation trenches 24 have substantially vertical sidewalls resulting from high selectivity to the masking function of patterned stacked layers 14'.

Figure 3:
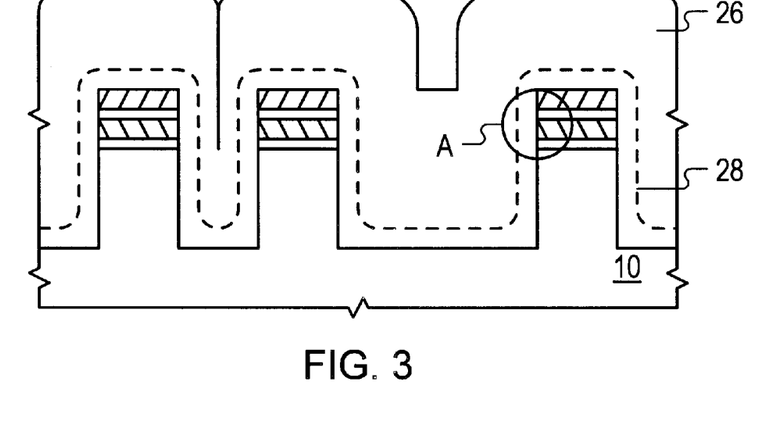
FIG. 3 illustrates a first oxide fill layer deposited over the trench isolation regions and silicon mesas of FIG. 2.

An LPCVD-deposited TEOS or an atmospheric-pressure ozone-TEOS is used to blanket deposit first fill oxide layer 26 across the entire wafer topography, including patterned stacked layers 14' and isolation trenches 24. It is understood that layer 26 may comprise several applications of oxide in order to fill small area isolation trenches, such as that shown in reference numeral 24'. The successive layers of oxide 28 form first fill oxide 26, as shown in FIG. 3. While first fill oxide 26 planarizes small isolation area 24' with substantially no voids, it cannot adequately fill large isolation area 24". A subsequent planarization process is needed to achieve global planarization across the entire wafer topography, i.e., across small isolation trenches 24' having a length less than 1.0 microns per side as well as across large isolation trenches 24" having a length greater than 2.0 microns per side.

Figure 4:
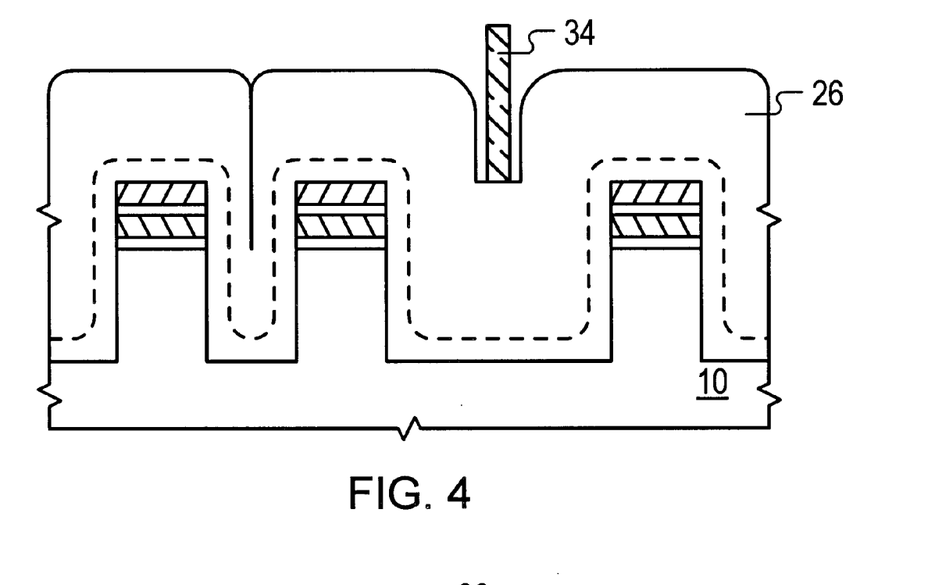
FIG. 4 illustrates a masking material placed over a portion of the lower elevation plane of the large trench isolation region.

FIG. 4 illustrates an initial processing step needed to achieve substantially full global planarization. In particular, a photoresist layer is selectively polymerized by mask 32 to present a hardened photoresist pattern 34, as shown. Hardened photoresist 34 is shown to be somewhat thin in cross-section, however, it is understood that the cross-sectional dimension will increase commensurate with the isolation trench area. Accordingly, FIG. 4 is shown only for illustrative purposes, and is not indicative of the size of all possible isolation trench of sizes and photoresist cross-sections.

Figure 5:
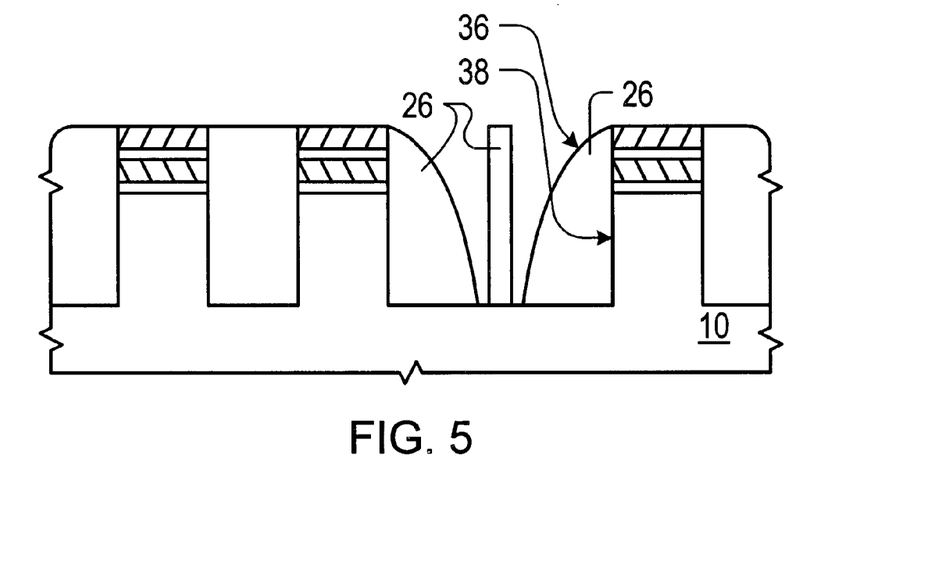
FIG. 5 illustrates an etch applied to the masked topography of FIG. 4.

FIG. 4, in combination with FIG. 5, illustrates the purpose of masking material 34 used to prevent etch removal of first fill oxide 26 underneath photoresist 34. In all other areas, first fill oxide 26 will be removed. In large isolation areas 24", the resulting first fill oxide 26 upper surface appears with spacers 36 on opposed silicon sidewalls 38. Spacers 36 extend toward one another and meet at or near first fill oxide 26 underlying photoresist 34. First fill oxide 26 is removed in small isolation trenches substantially flush with patterned stacked layers 14' upper surface. The reason for planarity in small isolation areas is due primarily to the planarization achieved by the previous fill steps. Although the fill steps cannot achieve global planarization, as shown in FIGS. 3–5, FIG. 6 illustrates a subsequent fill step used for planarizing large isolation region 24". The large isolation regions 24" are deemed those not capable of being filled with planarity by first fill oxide 26, and are thus those needing further fill and planarization steps described hereinbelow.

By depositing a second fill oxide 40 on top of the remaining first fill oxide 26, planarization of large isolation area trenches can be achieved. There may be instances when the second oxide, like the first oxide, requires patterned etch back, and the process repeated for a third oxide deposition. This process can be continued and repeated for as many oxides as are necessary to planarize large area isolation trenches. If the isolation trenches are relatively small in lateral dimension, then either one or two oxides is all that is needed. However, large area isolation trenches exceeding, for example, 50 to 100 microns might require numerous oxide deposition and selective etch back steps. FIGS. 3 through 6 illustrate, for brevity, only a first fill oxide 26 followed by a second fill oxide 40. Interposed between the first and second oxide deposition steps is a select removal step used in large area trenches which are not planarized by the step shown in FIG. 3.

Figure 6:
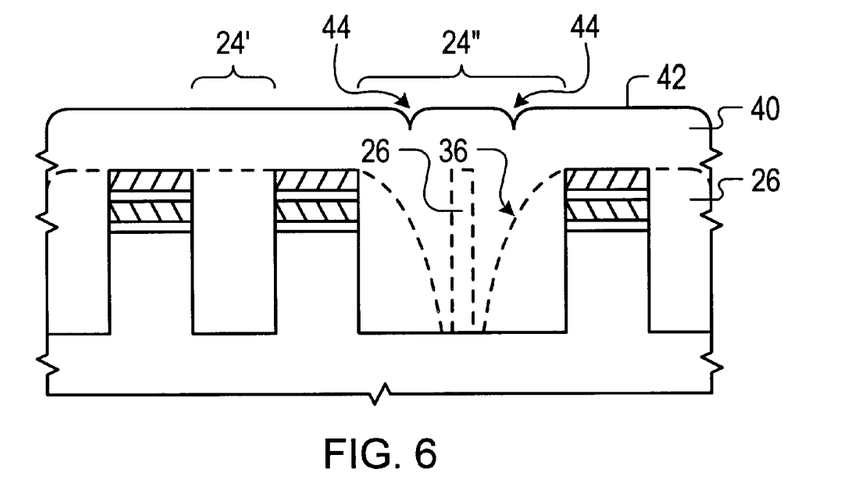
FIG. 6 illustrates a second oxide fill layer deposited over the trench isolation regions and silicon mesas formed in FIG. 5.

Second fill oxide 40 may retain indents 44 upon its upper surface 42. Indents 44 are in alignment above the area between spacer 36 and the masked portion of first fill oxide 26. Indents 44 are therefore in registry about the periphery of large area isolation regions, a spaced distance inside that periphery as defined by spacer 36. Spacer 36, in combination with masked oxide 26 aids the deposition of second fill oxide 40 over area 24".

Figure 7:
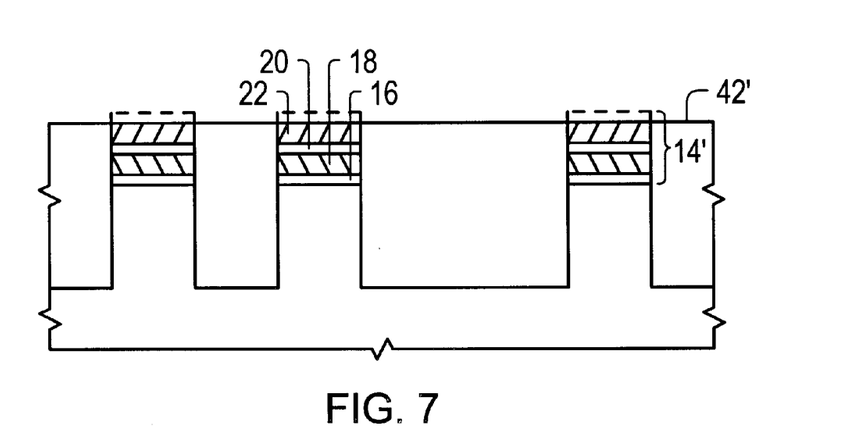
FIG. 7 illustrates a chemical-mechanical polish applied to the silicon oxide upper surface of FIG. 6.

FIG. 7 illustrates a step subsequent to that shown in FIG. 6. Namely, global planarization is achieved by chemical-mechanical polishing (CMP) upper surface 42 across the entire wafer surface. Upper surface 42 is preferably removed to an elevational level near the mid line thickness of nitride layer 22. CMP removes indents 40 to present a globally planarized upper surface 42'.

Figure 8:
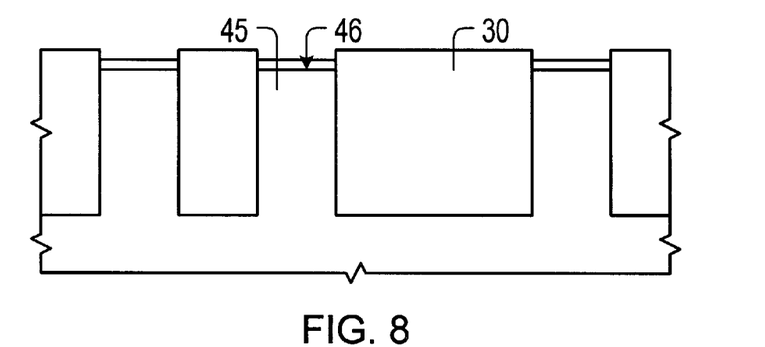
FIG. 8 illustrates removal of the stacked layers from the silicon mesas and the relative elevation levels of the silicon mesa and isolation region upper surfaces.

Using the same process for removing exposed regions of stacked layers 14, the remaining patterned stacked layers 14' are shown removed in the process step of FIG. 8. The high selectivity demonstrated by the various wet etch and plasma etch routines set forth above, are purposefully used to remove patterned stacked layers 14' so as not to significantly etch surface 42 beyond that of the silicon mesa upper surface. It is preferred, however, that a wet etch solution of HF or hot phosphoric acid ($H_3PO_4$) be used to strip the remaining nitride 22.

FIG. 8 illustrates the resulting structure having silicon mesa 45 upper surface 46 slightly recessed from the upper surface of filled isolation region 30. By carefully removing, according to the present features and process steps, patterned stacked layers 14' relative to filled isolation regions 30, the present process achieves the benefits of not exposing mesa 45 corners and sidewall. As such, present mesas 45 avoid two dimensional fringing fields and parasitic sidewall conductor problems associated with many conventional processes.

Figure 9:
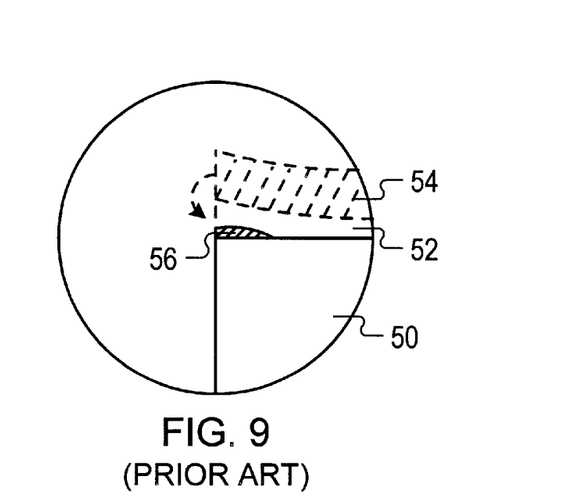
FIG. 9 is a detailed view along plane A of FIG. 3, showing a silicon mesa corner configured in a conventional fashion absent the stacked layers of FIG. 3.

Referring now to FIG. 9, a conventional silicon mesa 50 corner and sidewall is shown according to detail A of FIG. 3. Typically, conventional mesa 50 utilizes an oxide layer 52 and a nitride layer 54 instead of the present patterned stacked layer configuration 14'. A problem of conventional trench isolation techniques is illustrated when nitride 54 is removed and the reaction between the formation of removed nitrogen species combines on the upper surface of silicon mesa 50. The removed nitride species accumulates on the silicon to form silicon nitride 56. Silicon nitride 56 results from what is often referred to as the Kooi effect, or more specifically termed the white ribbon effect. Residue of white ribbon silicon nitride 56 causes problems during subsequent gate oxidation. A gate oxide formed on the upper surface of silicon mesa 50 will be locally thin over silicon nitride 56, leading to narrow gate width problems. Material 56 may also include a thermally grown oxide which occurs after the trenches are formed. Material 56 oxide drives the nitride 54 in an upward direction at the corner of each silicon mesa. The thickening of oxide results from the absence of a poly buffer layer. Local oxide thickening may leave the uneven formation of gate oxide on silicon mesa 50.

Figure 10:
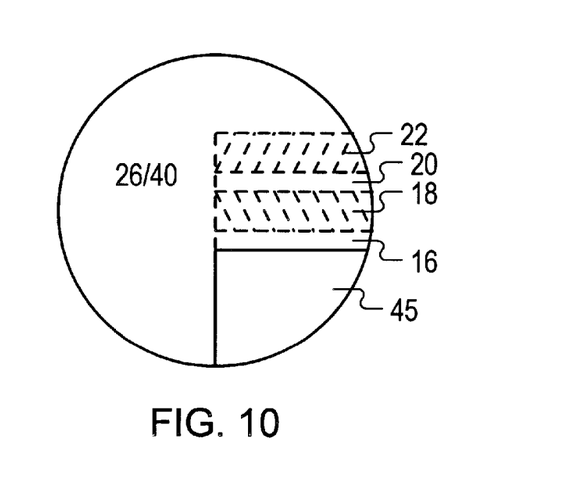
FIG. 10 is a detailed view along plane A, showing a silicon mesa corner after removal of the stacked layers according to present invention.

FIG. 10 illustrates the present process, relative to the conventional process shown in FIG. 9. Specifically, FIG. 10 illustrates the purpose of polysilicon layer 18, as well as first oxide 16 and second oxide 20. Polysilicon 18, in combination with oxide 26 and 40, serves to buffer migration of nitrogen from etched nitrogen layer 22. Moreover, polysilicon 18 minimizes thermal growth of oxide at the sidewall corners. Accordingly, local areas of silicon nitride and thermal oxide do not form, and the problems of localized gate oxide thinning do not appear.

It will be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for forming a silicon mesa between trench isolation regions, comprising:
   providing a wafer having a silicon substrate of substantially uniform substrate thickness;
   forming a first oxide upon said silicon substrate;
   depositing polysilicon upon said first oxide;
   depositing a second oxide upon said polysilicon;
   depositing silicon nitride upon said second oxide; and
   removing said silicon nitride, said second oxide, said polysilicon, said first oxide and a portion of said substrate thickness within regions across said wafer to form trench isolation regions, wherein each of said trench isolation regions extends from a sidewall of a silicon mesa active area to a sidewall of an opposing silicon mesa active area.

2. The method as recited in claim 1, wherein each trench isolation region of a pair of said trench isolation regions comprises a trench upper surface of substantially equal elevational height.

3. The method as recited in claim 2, wherein said removing step comprises retaining a silicon upper surface between said pair of trench isolation regions, said silicon upper surface being of greater elevational height than said trench upper surface.

4. The method as recited in claim 1, wherein said removing step occurs during a plurality of etch steps.

5. The method as recited in claim 1, wherein said removing step comprises:
   etch said silicon nitride in a solution comprising $H_3PO_4$ to expose said second oxide;
   etch said second oxide in a solution comprising HF to expose said polysilicon;
   etch said polysilicon in a plasma comprising $SF_6$ to expose said first oxide;
   etch said first oxide in a solution comprising HF to expose said silicon substrate; and
   etch partially through said silicon substrate in a solution comprising $HNO_3$ and HF.

6. The method as recited in claim 1, wherein said removing step comprises:

etch said silicon nitride in a solution comprising $H_3PO_4$ to expose said second oxide;

etch said second oxide in a plasma comprising a halogen species to expose said polysilicon;

etch said polysilicon in a plasma comprising $SF_6$ to expose said first oxide;

etch said first oxide in a solution comprising HF to expose said silicon substrate; and etch partially through said silicon substrate in a solution comprising $HNO_3$ and HF.

7. The method as recited in claim 1, further comprising selectively patterning an opening through a photoresist layer prior said removing step.

8. The method as recited in claim 1, further comprising selectively patterning an opening through a photoresist layer prior to the removal of said silicon nitride, prior to the removal of said second oxide, prior to the removal of said polysilicon, prior to the removal of said first oxide, and prior to the removal of the portion of said substrate thickness.

9. A method for forming a planarized integrated circuit topography, comprising:

removing layers of silicon nitride, oxide and polysilicon as well as a partial thickness of silicon substrate underlying said silicon nitride, oxide and polysilicon to form a spaced pair of isolation trenches within said semiconductor substrate;

depositing first fill oxide within said pair of isolation trenches;

remove a portion of said first fill oxide proximate to the outer periphery of each said pair of isolation trenches;

depositing second fill oxide within said pair of isolation trenches to form indents within an upper surface of said second fill oxide in registry above the region proximate the outer periphery of each said pair of isolation trenches;

chemical-mechanical polishing said second fill oxide and said first fill oxide to an elevational level approximately equal to the median of the layer of said silicon nitride; and removing the remaining layers of silicon nitride, oxide and polysilicon in regions between said pair of isolation trenches to form said planarized integrated circuit topography.

10. The method as recited in claim 9, wherein said isolation trenches are laterally spaced from each other.

11. The method as recited in claim 10, wherein said isolation trenches are laterally spaced from each other by a silicon mesa.

12. The method as recited in claim 11, wherein said silicon mesa comprises said remaining layers of silicon nitride, oxide and polysilicon removed from a silicon upper surface.

13. The method as recited in claim 12, wherein said isolation trenches comprises a silicon trench upper surface, and wherein the silicon trench upper surface is at an elevational height less than said silicon upper surface.

14. A method for forming a silicon mesa between a pair of trench isolation regions, comprising:

providing a wafer having a silicon substrate of substantially uniform substrate thickness;

forming a first oxide upon said silicon substrate;

depositing polysilicon upon said first oxide;

depositing a second oxide upon said polysilicon;

depositing silicon nitride upon said second oxide; and removing said silicon nitride, said second oxide, said polysilicon, said first oxide and a portion of said substrate thickness within a pair of regions across said wafer to form the pair of trench isolation regions, wherein said removing comprises:

etching said silicon nitride in a solution comprising $H_3PO_4$ to expose said second oxide;

etching said second oxide in a solution comprising HF to expose said polysilicon;

etching said polysilicon in a plasma comprising $SF_6$ to expose said first oxide;

etching said first oxide in a solution comprising HF to expose said silicon substrate; and etching partially through said silicon substrate in a solution comprising $HNO_3$ and HF.

15. A method for forming a silicon mesa between a pair of trench isolation regions, comprising:

providing a wafer having a silicon substrate of substantially uniform substrate thickness;

forming a first oxide upon said silicon substrate;

depositing polysilicon upon said first oxide;

depositing a second oxide upon said polysilicon;

depositing silicon nitride upon said second oxide; and removing said silicon nitride, said second oxide, said polysilicon, said first oxide and a portion of said substrate thickness within a pair of regions across said wafer to form the pair of trench isolation regions, wherein said removing comprises:

etching said silicon nitride in a solution comprising $H_3PO_4$ to expose said second oxide;

etching said second oxide in a plasma comprising a halogen species to expose said polysilicon;

etching said polysilicon in a plasma comprising $SF_6$ to expose said first oxide;

etching said first oxide in a solution comprising HF to expose said silicon substrate; and etching partially through said silicon substrate in a solution comprising $HNO_3$ and HF.

* * * * *